(12) United States Patent
Ishii

(10) Patent No.: US 12,292,471 B2
(45) Date of Patent: May 6, 2025

(54) TEST METHOD

(71) Applicant: FUJI ELECTRIC CO., LTD., Kanagawa (JP)

(72) Inventor: Kenichi Ishii, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 49 days.

(21) Appl. No.: 17/864,351

(22) Filed: Jul. 13, 2022

(65) Prior Publication Data
US 2023/0063471 A1 Mar. 2, 2023

(30) Foreign Application Priority Data
Sep. 1, 2021 (JP) .................. 2021-142744

(51) Int. Cl.
*G01R 31/28* (2006.01)

(52) U.S. Cl.
CPC ............... *G01R 31/2887* (2013.01)

(58) Field of Classification Search
CPC .......... G01R 31/2887; G01R 1/06705; G01R 31/2601; G01R 31/28; G01R 31/50; G01R 1/07364; G01R 31/2889; G01R 31/2851
USPC ....................................................... 324/756
See application file for complete search history.

(56) References Cited

U.S. PATENT DOCUMENTS

| | | | | |
|---|---|---|---|---|
| 5,838,023 A * | 11/1998 | Goel | ........... | H01L 22/32 |
| | | | | 257/781 |
| 10,267,849 B2 * | 4/2019 | Pagani | ........... | C12Q 1/00 |
| 2002/0013667 A1 * | 1/2002 | Zemer | ........... | G01R 1/06705 |
| | | | | 702/57 |
| 2007/0090851 A1 * | 4/2007 | Kim | ........... | G01R 1/06794 |
| | | | | 324/754.1 |
| 2009/0015280 A1 * | 1/2009 | Natori | ........... | G01R 31/2891 |
| | | | | 324/762.05 |
| 2010/0213963 A1 * | 8/2010 | Yoshikawa | ........ | G01R 31/2896 |
| | | | | 324/762.02 |
| 2012/0043983 A1 * | 2/2012 | Sawa | ........... | G01R 31/2891 |
| | | | | 324/750.19 |

(Continued)

FOREIGN PATENT DOCUMENTS

| | | |
|---|---|---|
| JP | 2010276477 A | 12/2010 |
| WO | WO-2014073168 A1 * | 5/2014 ............ H01L 22/14 |

OTHER PUBLICATIONS

Appel, Ken. "Intest Thermal Solutions Application Note—Hubspot." Electronics Thermal Testing—Improving Accuracy and Throughput, inTEST Thermal Solutions, Mar. 15, 2016, cdn2.hubspot.net/hubfs/5587493/Legacy%20Resources-PDFs/Thermal_Testing_DUT_control_application_note.pdf. (Year: 2016).*

*Primary Examiner* — Lisa M Caputo
*Assistant Examiner* — Joshua L Forristall

(57) ABSTRACT

Provided is a test method of a semiconductor apparatus comprising: first testing the semiconductor apparatus by bringing one or more probe pins into contact with a pad of the semiconductor apparatus; and second testing the semiconductor apparatus in a state where contact positions of the one or more probe pins with respect to the pad are different from those of the first testing. In the first testing, the one or more probe pins may be brought into contact with first positions and second positions on the pad, and in the second testing, the one or more probe pins may be brought into contact between the first positions and the second positions on the pad.

20 Claims, 18 Drawing Sheets

(56) References Cited

U.S. PATENT DOCUMENTS

2016/0334464 A1* 11/2016 Wong .................. G01R 31/2887
2020/0064374 A1* 2/2020 Fukami .................. G01R 31/50

* cited by examiner

TEST METHOD

The contents of the following Japanese patent application are incorporated herein by reference:
NO. 2021-142744 filed in JP on Sep. 1, 2021.

BACKGROUND

1. Technical Field

The present invention relates to a test method of a semiconductor apparatus.

2. Related Art

A method for screening a semiconductor apparatus such as a transistor has been known (see Patent Document 1, for example).
Patent Document 1: Japanese Patent Application Publication No. 2010-276477

DESCRIPTION OF EXEMPLARY EMBODIMENTS

Hereinafter, (some) embodiment(s) of the present invention will be described. The embodiment(s) do(es) not limit the invention according to the claims. Also, not all combinations of features described in the embodiments necessarily have to be essential to solving means of the invention.

In this specification, one side of a semiconductor substrate (or a semiconductor apparatus) in a direction parallel to a depth direction is referred to as "upper", and the other side is referred to as "lower". One of two main surfaces of a substrate, a layer, or other members is referred to as an upper surface, and the other surface as a lower surface. "Upward" and "downward" directions are not limited to a direction of gravitational force or a direction at the time of mounting a semiconductor apparatus.

In this specification, technical matters may be described by using orthogonal coordinate axes of an X axis, a Y axis, and a Z axis. The orthogonal coordinate axes merely specify relative positions of components, and do not limit a specific direction. For example, the Z axis does not limitedly indicate a height direction with respect to a ground. It should be noted that a +Z axis direction and a −Z axis direction are opposite to each other. When a direction is described as a Z axis direction without any positive or negative sign described, this means that the direction is parallel to a +Z axis and a −Z axis.

In this specification, orthogonal axes parallel to an upper surface and a lower surface of the semiconductor substrate (or the semiconductor apparatus) are defined as the X axis and the Y axis. Moreover, an axis perpendicular to the upper surface and the lower surface of the semiconductor substrate (or the semiconductor apparatus) is defined as the Z axis. In this specification, the Z axis direction may be referred to as a depth direction. Moreover, in this specification, a direction parallel to the upper surface and the lower surface of the semiconductor substrate (or the semiconductor apparatus) including the X axis and the Y axis may be referred to as a horizontal direction.

When referred to as "same" or "equal" in this specification, this may include a case where there is an error caused by production tolerance or the like. That error is, for example, within 10%.

Figure 1A:
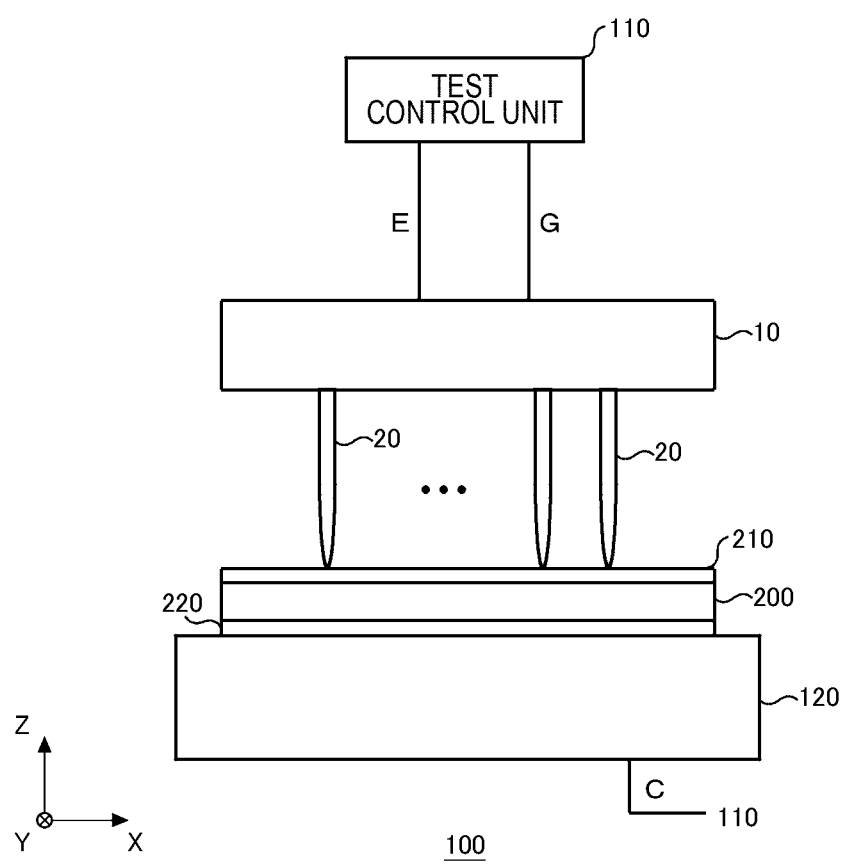
FIG. 1A schematically shows a test apparatus 100 for testing a semiconductor apparatus 200 according to one embodiment of the present invention.

FIG. 1A schematically shows a test apparatus 100 for testing a semiconductor apparatus 200 according to one embodiment of the present invention. The semiconductor apparatus 200 includes, for example, an Insulated Gate Bipolar Transistor (IGBT) element, but may include another semiconductor element. One semiconductor apparatus 200 may be composed of one chip. When tested, the semiconductor apparatus 200 may be in a state of a wafer on which a plurality of chips are formed, or may be in a state of a chip cut out of the wafer.

An upper surface and a lower surface of the semiconductor apparatus 200 in this example are provided with an upper surface pad 210 and a lower surface pad 220. The upper surface pad 210 is, for example, an emitter electrode of an IGBT. The lower surface pad 220 is, for example, a collector electrode of an IGBT. The semiconductor apparatus 200 in this example is a vertical device in which a current flows between the upper surface pad 210 and the lower surface pad 220 when the semiconductor apparatus 200 is controlled to be in an on-state. In another example, the semiconductor apparatus 200 may be a horizontal device in which both the emitter electrode and the collector electrode are arranged on the upper surface. The upper surface pad 210 and the lower surface pad 220 in this example are formed of a metal material such as aluminum. At least one of the upper surface or the lower surface of the semiconductor apparatus 200 may be provided with a pad other than the upper surface pad 210 and the lower surface pad 220.

The test apparatus 100 tests the semiconductor apparatus 200. The test apparatus 100 in this example passes a current through the semiconductor apparatus 200 under a predetermined condition, and sorts one that has been broken and one that has not been broken. Such a test can eliminate in advance the semiconductor apparatus 200 that is easily broken, to reduce a failure probability of the semiconductor apparatus 200 such as after shipment.

The test apparatus 100 in this example includes a test control unit 110, a contact portion 10, and a stage 120. The stage 120 supports the semiconductor apparatus 200 under test. The stage 120 may be provided with a terminal electrically connected to the lower surface pad 220.

The contact portion 10 has one or more probe pins 20. The probe pin 20 is formed of a metal material such as copper. The test apparatus 100 is electrically connected to the semiconductor apparatus 200 by bringing the probe pin 20 into contact with the upper surface pad 210. The contact portion 10 may include the probe pin 20 coming into contact with a pad other than the upper surface pad 210.

The test control unit 110 controls the test of the semiconductor apparatus 200. The test control unit 110 in this example controls at least one of a current or a voltage applied to the semiconductor apparatus 200 via the probe pin 20. The test control unit 110 may be electrically connected to the lower surface pad 220 via the stage 120. The test control unit 110 may control a timing of increase and decrease and may control waveforms such as an amplitude and an inclination, for the current and the voltage. The test control unit 110 in this example may be connected to each of an emitter electrode E, a collector electrode C, and a gate electrode G of the semiconductor apparatus 200. Moreover, the test control unit 110 may measure at least one of the current or the voltage applied to the semiconductor apparatus 200 via the probe pin 20. The test control unit 110 may determine, based on electrical measurement result, whether the semiconductor apparatus 200 has been broken. For example, the test control unit 110 determines that the semiconductor apparatus 200 has been broken, when a current equal to or greater than a reference value flows through the semiconductor apparatus 200.

Figure 1B:
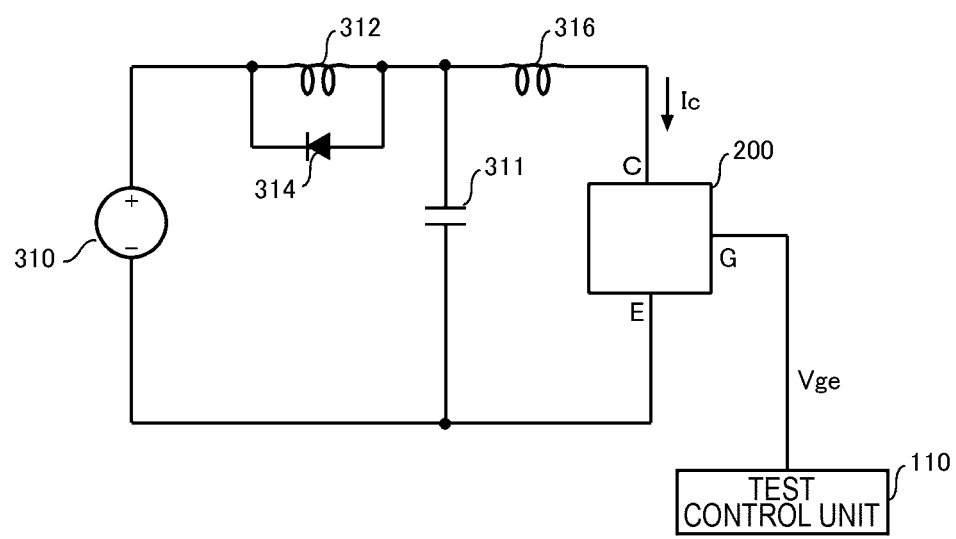
FIG. 1B is a circuit diagram schematically showing the test apparatus 100.

FIG. 1B is a circuit diagram schematically showing the test apparatus 100. The test apparatus 100 supplies a voltage and a current to the semiconductor apparatus 200 under a predetermined condition, and determines a quality of the semiconductor apparatus 200 based on operation of the semiconductor apparatus 200. The test apparatus 100 may measure at least one of a voltage between the emitter electrode E and the collector electrode C of the semiconductor apparatus 200 or a current Ic flowing through the collector electrode C. As described in FIG. 1A, the test apparatus 100 in this example is connected to each of the emitter electrode E, the collector electrode C, and the gate electrode G of the semiconductor apparatus 200 via the probe pin 20 and the stage 120.

The test apparatus 100 has the test control unit 110, a power source 310, a capacitor 311, a coil 312, a coil 316, and a diode 314. The test control unit 110 supplies a gate voltage Vge to each semiconductor apparatus 200.

The power source 310 generates an electrical power to be supplied to the semiconductor apparatus 200. The capacitor 311 is for stabilizing the power source. The coil 312 is arranged between the power source 310 and the collector electrode C of the semiconductor apparatus 200. The coil 316 is arranged between the coil 312 and the collector electrode C of the semiconductor apparatus 200. The diode 314 is connected in parallel to the coil 312. When the semiconductor apparatus 200 is turned off, the diode 314 refluxes, to the power source 310 side, the current that was flowing through the semiconductor apparatus 200.

Moreover, the coil 316 may have an inductive component value that is adjustable. For example, the test apparatus 100 includes a plurality of coils 316 in parallel having different inductive component values, and may include a switch for choosing the coil 316 to be connected between the coil 312 and the semiconductor apparatus 200. Adjusting the inductive component of the coil 316 can adjust an inclination of a waveform of the current Ic of the semiconductor apparatus 200.

The test control unit 110 in this example determines the quality of the semiconductor apparatus 200 based on the operation of the semiconductor apparatus 200 for when the semiconductor apparatus 200 is turned off. The test control unit 110 may determine the quality of the semiconductor apparatus 200 based on a waveform of at least one of the current Ic or the voltage Vce of the semiconductor apparatus 200.

The test control unit 110 may test a reverse bias safe operation area (RBSOA) of the semiconductor apparatus 200. The test control unit 110 in this example may determine whether the current Ic and the voltage Vce for when semiconductor apparatus 200 through which a predetermined test current is flowing is turned off transitions within a predetermined range. The test control unit 110 may determine whether a magnitude or the like of a surge of the voltage Vce at the time of turn-off satisfies a predetermined reference.

Figure 2:
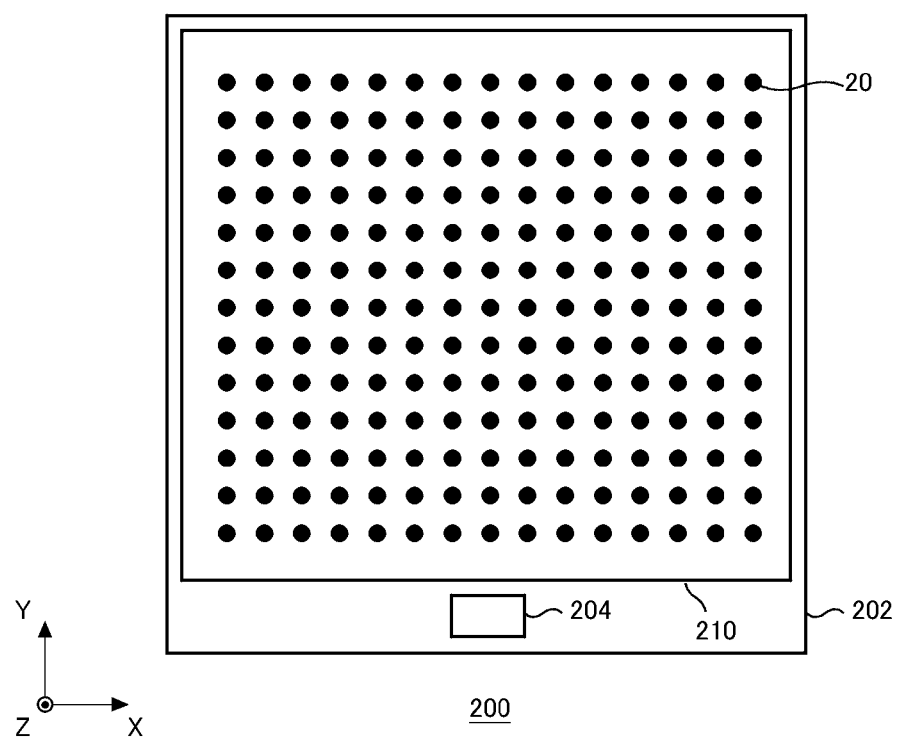
FIG. 2 schematically shows an upper surface structure of the semiconductor apparatus 200.

FIG. 2 schematically shows an upper surface structure of the semiconductor apparatus 200. FIG. 2 shows a chip-like semiconductor apparatus 200. The semiconductor apparatus 200 has a semiconductor substrate 202. The semiconductor substrate 202 is formed of a semiconductor material such as silicon. An upper surface of the semiconductor substrate 202 is provided with the upper surface pad 210. The upper surface of the semiconductor substrate 202 in this example is provided with a control pad 204 electrically separated from the upper surface pad 210. For example, a gate voltage for controlling the semiconductor apparatus 200 to be in an on- or off-state is applied to the control pad 204.

The one or more probe pins 20 come into contact with the upper surface pad 210. In FIG. 2, one probe pin 20 is indicated by one filled circle. A current flows through the semiconductor apparatus 200 via the probe pin 20. Preferably, a plurality of probe pins 20 come into contact with the upper surface pad 210 such that the current flowing through the semiconductor apparatus 200 is equalized within the upper surface of the semiconductor apparatus 200. The plurality of probe pins 20 are preferably arranged two-dimensionally. Two-dimensionally means that the plurality of probe pins 20 are arranged along at least two directions in an XY plane. In the example of FIG. 2, the probe pins 20 are arranged at a regular interval along each of an X axis direction and a Y axis direction.

Figure 3:
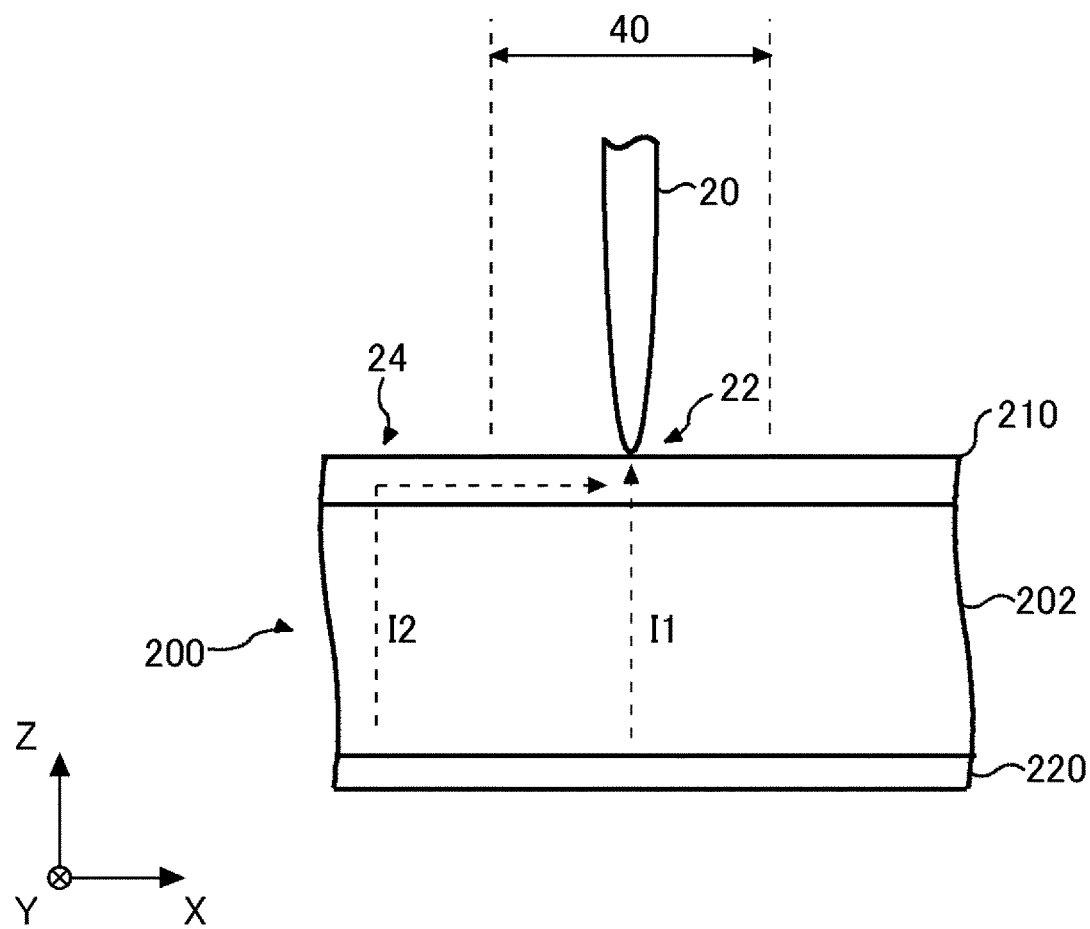
FIG. 3 illustrates an example of a path of a current flowing through a probe pin 20.

FIG. 3 illustrates an example of a current flowing through the probe pin 20. In this example, a point on the upper surface pad 210 where the probe pin 20 comes into contact therewith is defined as a position 22. Moreover, a point on the upper surface pad 210 which is away from the probe pin 20 is defined as a position 24.

A current I1 having flowed from the lower surface pad 220 to the upper surface pad 210 directly beneath the position 22 passes through the upper surface pad 210 in a thickness direction (Z axis direction). On the other hand, a current I2 having flowed from the lower surface pad 220 to the upper surface pad 210 directly beneath the position 24 passes through the upper surface pad 210 from the position 24 to the position 22. As such, a path by which the current I2 passes through the upper surface pad 210 is longer a path by which the current I1 passes through the upper surface pad 210. Therefore, a resistance value of the path through which the current I2 passes is greater than a resistance value of the path through which the current I1 passes. The resistance value of the path through which the current I2 passes is greater as the position 24 is farther away from the position 22.

Since the resistance value of the current path is greater, the current I2 is smaller than the current I1. As such, the semiconductor apparatus 200, which has an easily broken point (referred to as a defective point in this specification) directly beneath the position 24 and should be originally sorted as a defective product, may be determined as a non-defective product without breakage generated in the test.

That is, if there is a defective point in the vicinity of the probe pin 20, screening can be performed in the test of the semiconductor apparatus 200, but if there is a defective point at a position away from the probe pin 20, the semiconductor apparatus 200 may be shipped while the screening cannot be performed. When the semiconductor apparatus 200 broken after shipment is analyzed, a broken point is detected at a place away from the probe pin 20, and the broken point is not detected in the vicinity of the probe pin 20. It can be seen that, since the semiconductor apparatus 200 before the test is considered to have had a defective point regardless of the position of the probe pin 20, the semiconductor apparatus 200 having a defective point in the vicinity of the probe pin 20 has been able to be screened at the time of the test while the semiconductor apparatus 200 having a defective point away from the probe pin 20 may have been unable to be screened at the time of the test.

In FIG. 3, when there is a defective point, a range where that defective point is broken at the time of the test is defined as a test area 40. The test area 40 may be preset in the test control unit 110. For example, the test area 40 is a circular range with the position 22 as a center in the XY plane. The test area 40 may be a range defined by analyzing the semiconductor apparatus 200 broken after shipment. That is, in the semiconductor apparatus 200 broken after shipment, an area where the broken point is not detected may be the test area 40. A contact trace remains at the position 22 with which the probe pin 20 came into contact on the upper surface pad 210. In the semiconductor apparatus 200 broken after shipment, the test area 40 can be determined by analyzing a positional relationship between the contact trace and the broken point.

Moreover, the test area 40 may be a range defined by a structure and a test condition of the semiconductor apparatus 200. The test condition may be amplitudes and inclinations of the voltage and the current to be applied to the semiconductor apparatus 200 as well as an ambient temperature. If the test condition is such that the semiconductor apparatus 200 is easily broken, the test area 40 becomes large, while if the test condition is such that the semiconductor apparatus 200 is hardly broken, the test area 40 becomes small. Moreover, the structure of the semiconductor apparatus 200 is, for example, a resistance value or the like per unit length of the upper surface pad 210 in the XY plane. The current I2 more hardly flows to the position 24 away from the probe pin 20 as the resistance value of the upper surface pad 210 is greater, so that the test area 40 becomes small.

Figure 4:
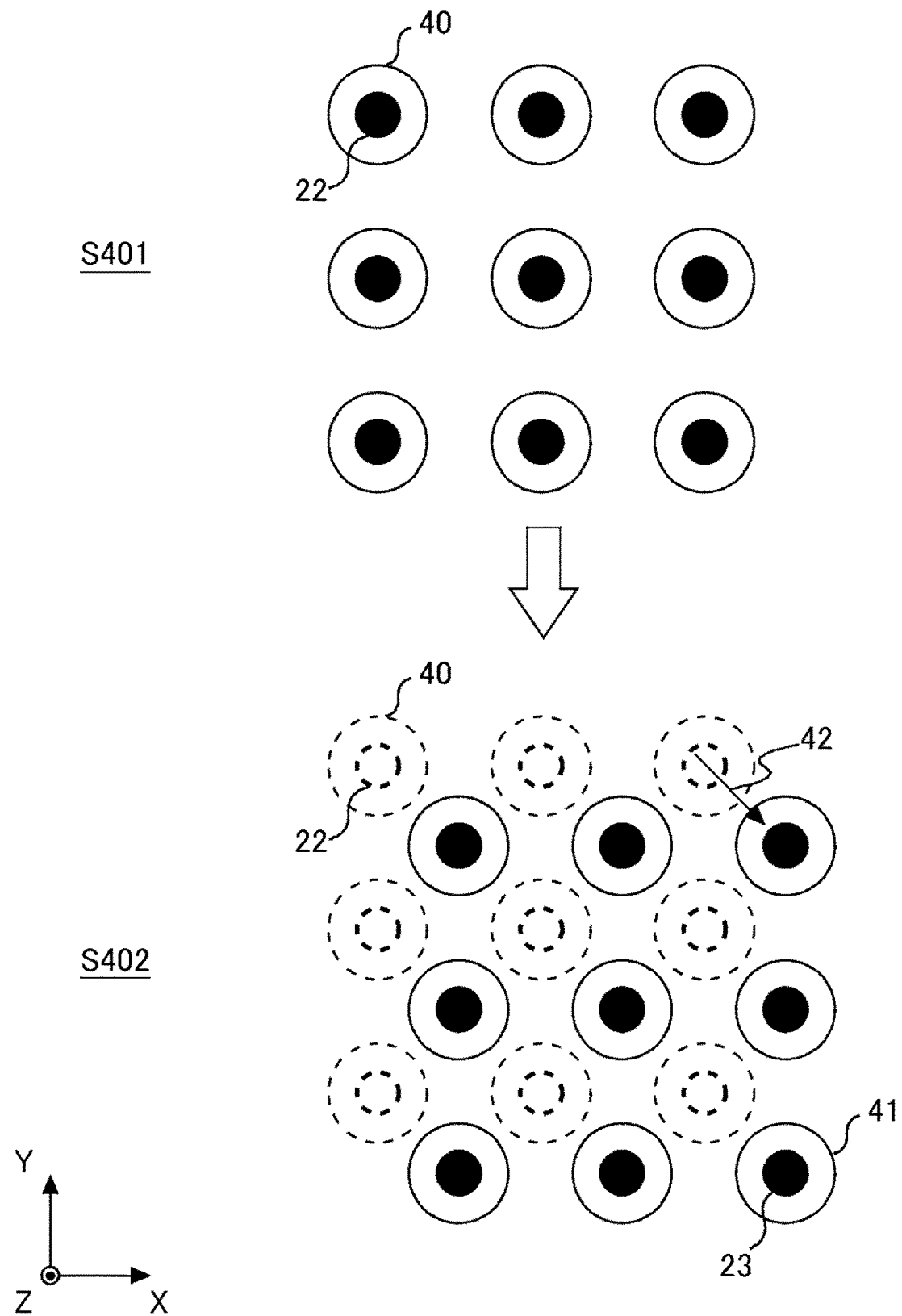
FIG. 4 illustrates an embodiment example of a test method of the semiconductor apparatus 200.

FIG. 4 illustrates an embodiment example of a test method of the semiconductor apparatus 200. The test method in this example has a first test step S401 and a second test step S402. The first test step S401 and the second test step S402 are both tests in which a current is passed through the semiconductor apparatus 200 under a predetermined condition to sort a broken semiconductor apparatus 200.

In FIG. 4, a position with which a probe pin 20 comes into contact on a surface of an upper surface pad 210 is indicated by a filled circle, and a test area with that position as a center is indicated by a circle. FIG. 4 shows an enlarged view of a part of the upper surface pad 210.

In the first test step S401 in this example, probe pins 20 are brought into contact with the upper surface pad 210 at one or more positions 22. There is a test area 40 (first test area) in the vicinity of each of the positions 22. In the first test step S401, a size (radius, for example) of the test area 40 may or may not be set in a test control unit 110. If there is a defective point in any test area 40, the semiconductor apparatus 200 is broken in the first test step S401. However, the semiconductor apparatus 200 having a defective point outside the test area 40 is likely to be determined as a non-defective product without being broken. In this case, that semiconductor apparatus 200 is relatively likely to be broken after shipment.

In the second test step S402, the probe pins 20 are brought into contact with the upper surface pad 210 at one or more positions 23. There is a test area 41 (second test area) in the vicinity of each of the positions 23. In the second test step S402, a size (radius, for example) of the test area 41 may or may not be set in a test control unit 110.

In the second test step S402, the position 23 of the probe pin 20 is different from the position 22 of the probe pin 20 in the first test step S401. This can arrange the test area 41 at a position different from that of the test area 40. Therefore, a defective point in an area that could not be covered by the test area 40 can be covered by the test area 41. As such, the semiconductor apparatus 200 having a defective point is easily sorted.

The first test step S401 and the second test step S402 may be for testing the semiconductor apparatus 200 under different conditions. For example, a test is known in which a current is passed through the semiconductor apparatus 200 at different ambient temperatures to determine whether the semiconductor apparatus 200 is broken. The first test step S401 and the second test step S402 may be tests to be performed at different ambient temperatures. This can improve sorting precision of the semiconductor apparatus 200 without increasing the number of test processes. A test condition may be a magnitude of a voltage or a current to be applied to the semiconductor apparatus 200, an inclination of a waveform, or the like.

The first test step S401 and the second test step S402 may be for testing the semiconductor apparatus 200 under a same condition. As described above, a test is known in which a current is passed through the semiconductor apparatus 200 at different ambient temperatures to determine whether the semiconductor apparatus 200 is broken. In this case again, the first test step S401 and the second test step S402 may be performed at a same ambient temperature. For example, when the semiconductor apparatus 200 is tested at two ambient temperatures of a room temperature (25 degrees C. and a hot temperature higher than the room temperature, both the first test step S401 and the second test step S402 may be performed at the room temperature, both the first test step S401 and the second test step S402 may be performed at the hot temperature, or both the first test step S401 and the second test step S402 may be performed at both the room temperature and the hot temperature. In this case, the number of test processes is increased, but the sorting precision of the semiconductor apparatus 200 can be further improved. It should be noted that, in four test steps of the first test step S401 and the second test step S402 performed under a first condition as well as the first test step S401 and the second test step S402 performed under a second condition, their respective positions where the probe pins 20 are brought into contact with the upper surface pad 210 may be different.

It should be noted that, in the first test step S401 and the second test step S402, a same contact portion 10 may be used or different contact portions 10 may be used. When the same contact portion 10 is used, relative positions between the contact portion 10 and the upper surface pad 210 are shifted in the first test step S401 and the second test step S402. In FIG. 4, a shift amount of the relative positions between the contact portion 10 and the upper surface pad 210 is indicated by an arrow 42. When the different contact portions 10 are used, a position of the probe pin 20 on each of the contact portions 10 is shifted.

Figure 5:
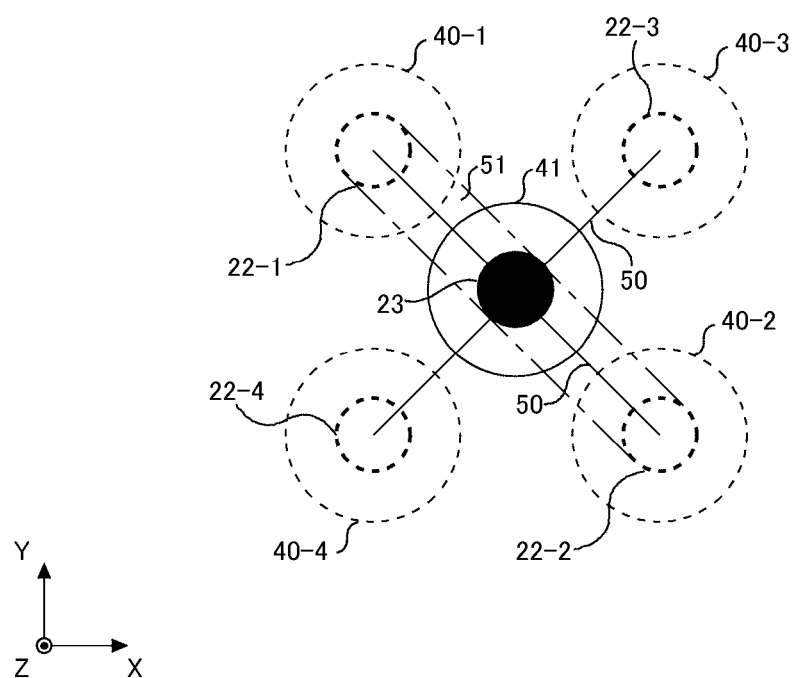
FIG. 5 illustrates a relationship between a position 22 and a position 23.

FIG. 5 illustrates a relationship between a position 22 and a position 23. In FIG. 5, one position 23 and four positions 22 around the position 23 are enlarged. The positions 22 are arranged at a regular interval along the X axis direction and the Y axis direction. The four positions 22 shown in FIG. 5 are adjacently arranged in the X axis direction or adjacently arranged in the Y axis direction. That is, a first position 22-1 and a third position 22-3 are adjacent to each other in the X axis direction, a second position 22-2 and a fourth position 22-4 are adjacent to each other in the X axis direction, the first position 22-1 and the fourth position 22-4 are adjacent to each other in the Y axis direction, and the third position 22-3 and the second position 22-2 are adjacent to each other in the Y axis direction. The four positions 22 are located at vertices of a rectangle or a square. The first position 22-1 and the second position 22-2 are diagonally located, and the third position 22-3 and the fourth position 22-4 are diagonally located.

The position 23 in this example is arranged between the first position 22-1 and the second position 22-2. That is, the test area 41 is arranged so as to fill an area between a first test area 40-1 and a second test area 40-2. Between the first position 22-1 and the second position 22-2 refers to an area 51 connecting ends of the first position 22-1 and the second position 22-2. In FIG. 5, the area 51 is a portion sandwiched by dashed-dotted lines. The position 23 is at least partially arranged in the area 51. The position 23 may be entirely arranged in the area 51.

When a position of the probe pin 20 is shifted only once, the position 23 is preferably arranged at a midpoint between the first position 22-1 and the second position 22-2. The midpoint between the first position 22-1 and the second position 22-2 refers to a point where a distance to the first position 22-1 and a distance to the second position 22-2 are equal between the first position 22-1 and the second position 22-2. The position 23 may be arranged so as to overlap with that midpoint. A center of the position 23 may be coincide with or shifted from that midpoint. Moreover, the position 23 may be arranged such that the test area 41 includes that midpoint.

The position 23 may be arranged at a center of a quadrangle formed by the four positions 22. The center of the quadrangle refers to a point of intersection of diagonal lines 50. The position 23 may be arranged so as to overlap with the point of intersection of the diagonal lines 50. The center of the position 23 may be coincide with or shifted from the center of that quadrangle.

Moreover, when a size of each of the test areas is preset in the test control unit 110, the position 23 in the second test step S401 is preferably set such that a portion where the test area 40 and the test area 41 overlap with each other is minimized. This can maximize a range that can be covered by each of the test areas. As shown in FIG. 5, the test area 40 and the test area 41 may be arranged so as not to overlap with each other.

Figure 6:
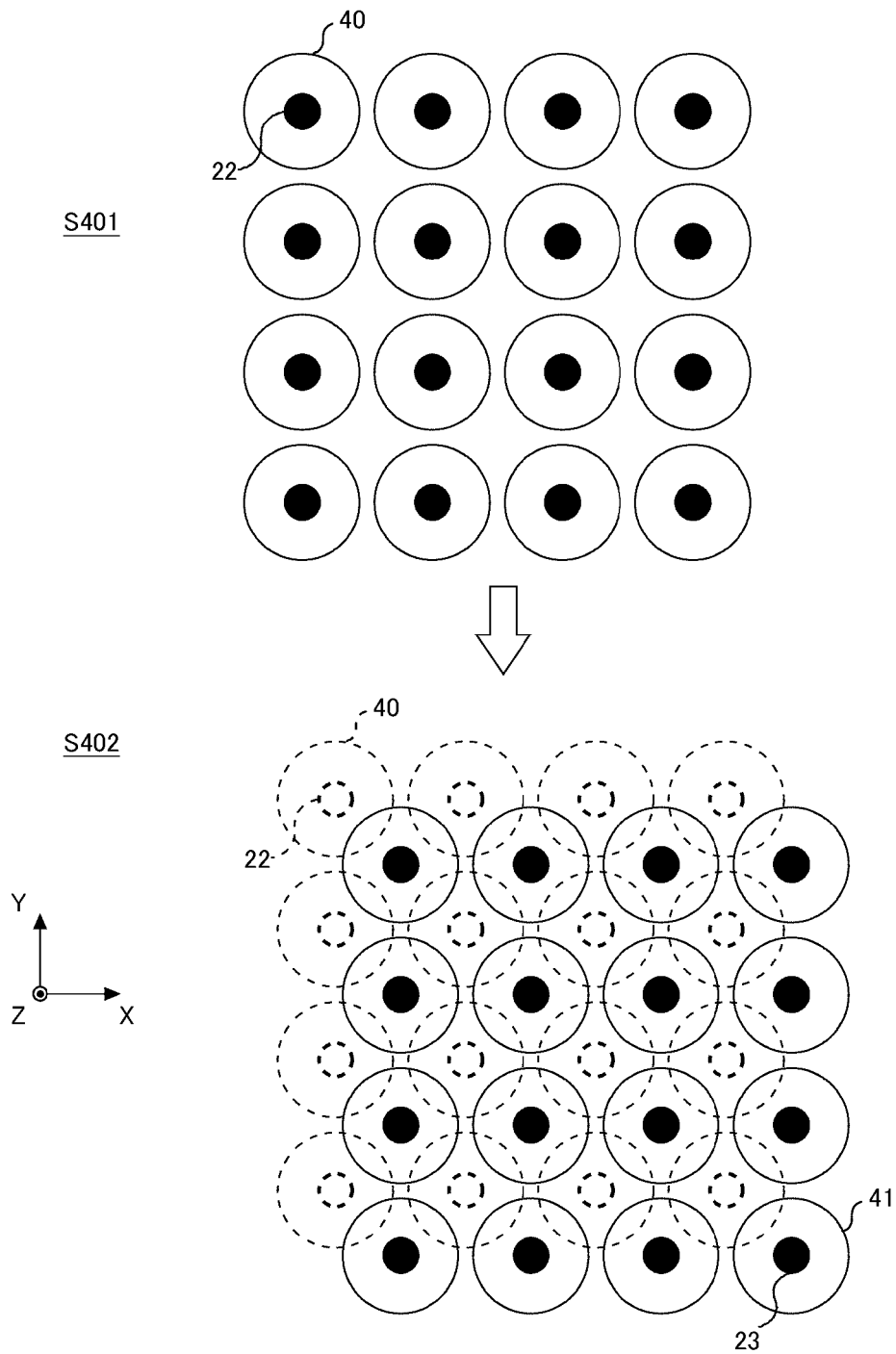
FIG. 6 shows other examples of a test area 40 and a test area 41.

FIG. 6 shows other examples of the test area 40 and the test area 41. The test area 40 and the test area 41 in this example are larger than those shown in the example of FIG. 5. Except for that, this example is similar to those described in FIG. 1A to FIG. 5. The test area 40 and the test area 41 do not overlap with each other in the example of FIG. 5, but as shown in FIG. 6, the test area 40 and the test area 41 may overlap with each other. In this case again, the position 23 in the second test step S401 is preferably set such that the portion where the test area 40 and the test area 41 overlap with each other is minimized. For example, the position 23 is arranged at a center of a quadrangle formed by the four positions 22. The position 23 may be arranged so as not to overlap with the test area 40.

Figure 7:
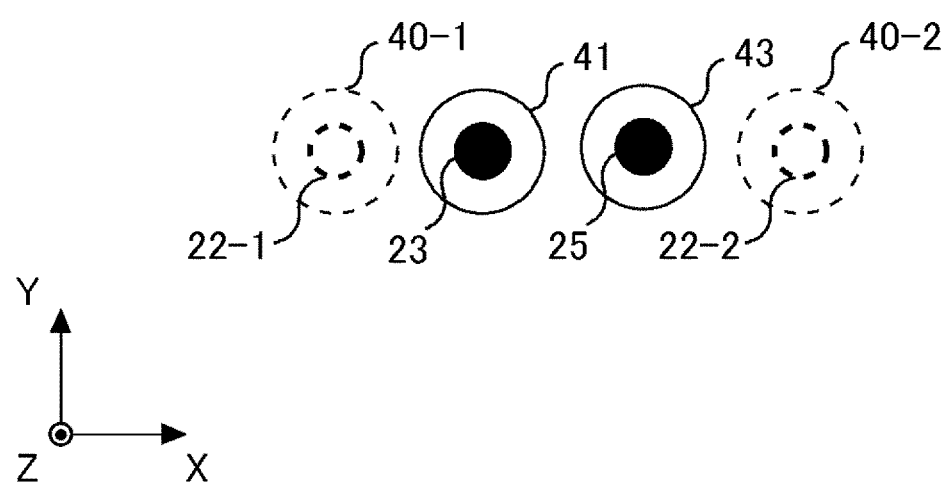
FIG. 7 shows another example of a contact position between the probe pin 20 and an upper surface pad 210.

FIG. 7 shows another example of a contact position between the probe pin 20 and the upper surface pad 210. In FIG. 7 shows contact positions of some of the probe pins 20 on the contact portion 10. In this example, a third test step is provided in addition to the first test step S401 and the second test step S402. In the third test step, the probe pin 20 is brought into contact with the upper surface pad 210 at a position different from those shown in both the first test step S401 and the second test step S402. The contact position of the probe pin 20 in the third test step is defined as a position 25. Moreover, there is a test area 43 with the position 25 as a center.

The position 23 and the position 25 may be arranged between the first position 22-1 and the second position 22-2. The first position 22-1, the second position 22-2, the position 23, and the position 25 may be arranged at an even interval, or may be arranged at different intervals. For example, distances between the respective probe pins 20 may be defined according to sizes of their corresponding test areas. The respective test areas 40, 41, and 43 are preferably arranged such that portions where they overlap with each other are minimized. The respective test areas 40, 41, and 43 may be arranged so as not to overlap with each other as shown in FIG. 7, or may be arranged so as to overlap with each other as in the example of FIG. 6.

The sizes of the test area 40, the test area 41, and the test area 43 may be same or different. The test control unit 110 may adjust the size of at least any of the test area 40, the test area 41, and the test area 43 according to a test condition of each of the test steps. Moreover, when the first test step S401 and the second test step S402 are provided and the third test step is not provided, the test control unit 110 may adjust the size of at least one of the test area 40 or the test area 41 according to the test condition of each of the test steps. As described above, if the test condition is such that the semiconductor apparatus 200 is more easily broken, the test area may be set larger. Even when the sizes of the test area 40 and the test area 41 are different, the position 23 of the probe pin 20 in each of the test steps is preferably set such that the portions where the respective test areas overlap with each other are minimized.

Figure 8:
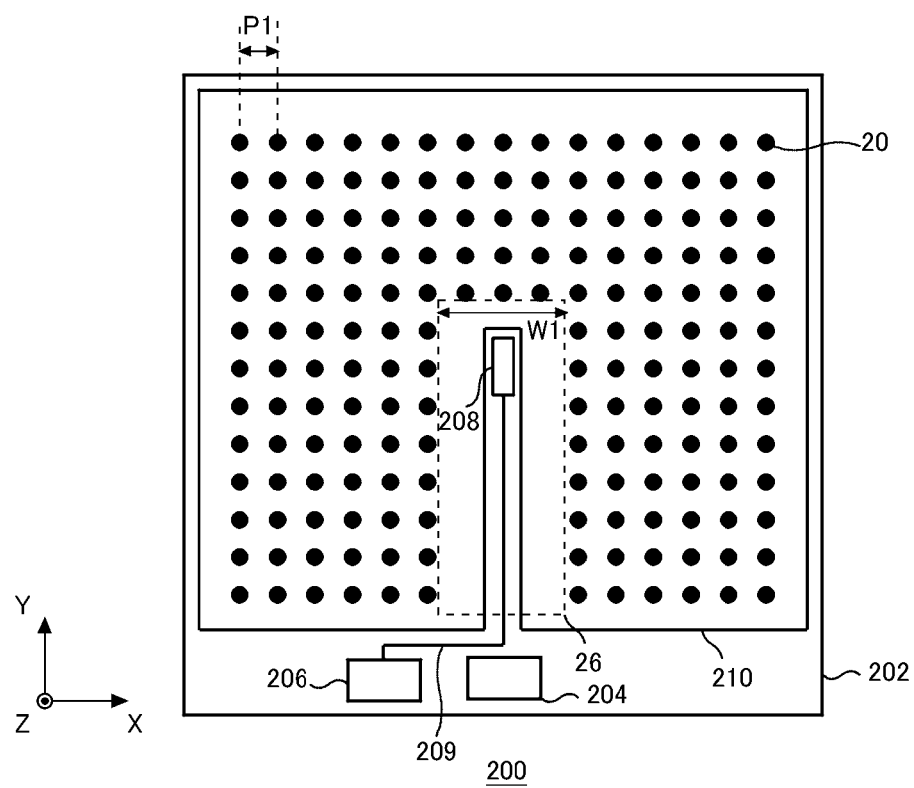
FIG. 8 shows another configuration example of the semiconductor apparatus 200.

FIG. 8 shows another configuration example of the semiconductor apparatus 200. A diode element 208 is arranged so as not to overlap with the upper surface pad 210 on the upper surface of the semiconductor apparatus 200 in this example. For example, the diode element 208 is arranged in a vicinity of a center of the semiconductor substrate 202. The diode element 208 may be used to measure a temperature of the semiconductor apparatus 200. The diode element 208 is connected to a measuring pad 206 via a wiring 209. FIG. 8 schematically shows one wiring 209 and one measuring pad 206, but the wiring 209 and the measuring pad 206 are provided to each of an anode terminal and a cathode terminal of the diode element 208. The wiring 209 has a portion extending from the diode element 208 in the Y axis direction.

The contact portion 10 in this example has a plurality of probe pins 20 arranged at a regular arrangement interval P1 in the X axis direction (first direction). Moreover, the contact portion 10 has a non-arrangement area 26 where the probe pins 20 are not arranged. In the X axis direction, the probe pins 20 are arranged on both sides of the non-arrangement area 26. The non-arrangement area 26 has a first width W1 larger than the arrangement interval P1 in the X axis direction. For example, the first width W1 twice or more as large as the arrangement interval P1.

Figure 9:
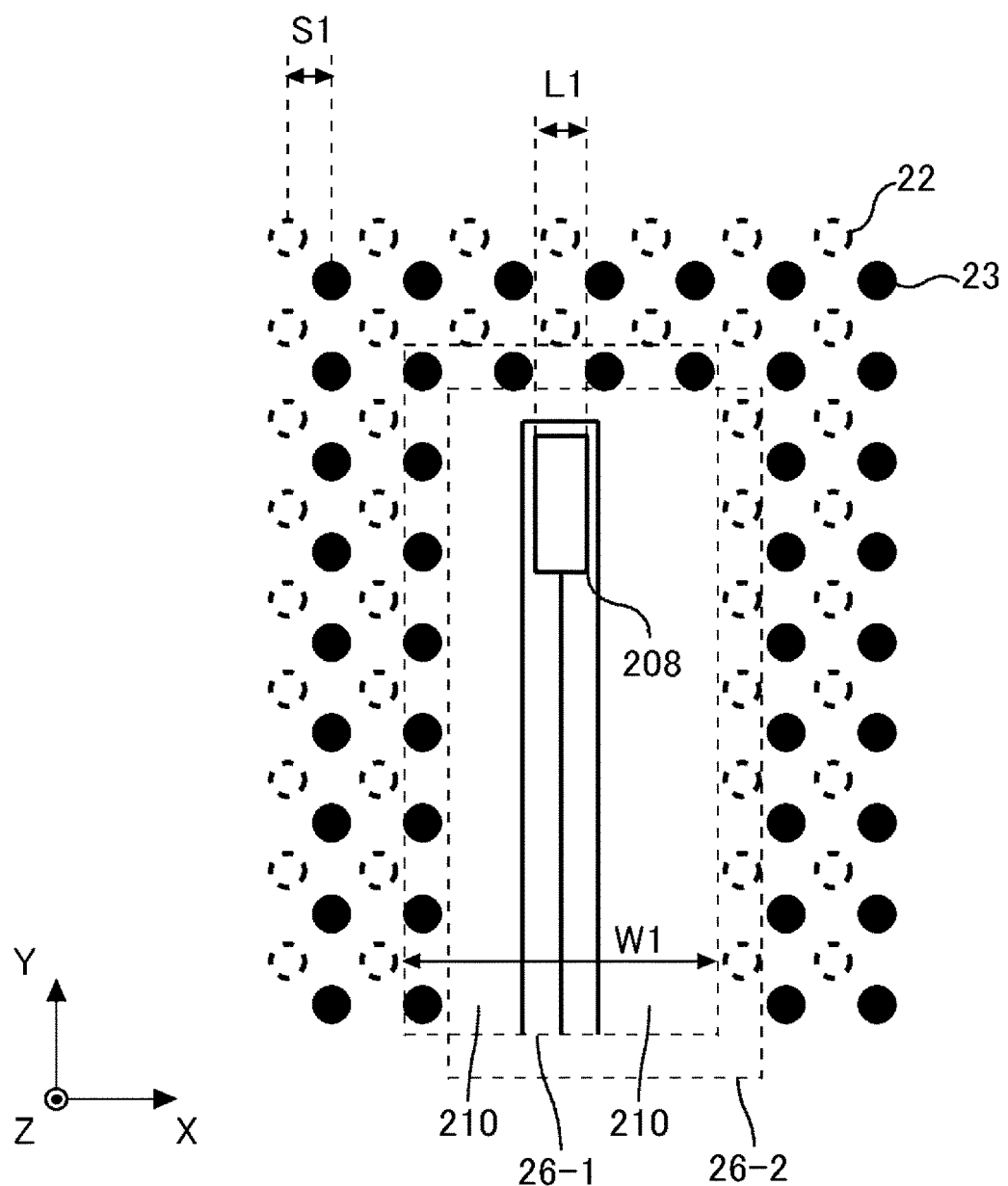
FIG. 9 shows examples of the position 22 of the probe pin 20 in a first test step S401 and the position 23 of the probe pin 20 in a second test step S402.

FIG. 9 shows examples of the position 22 of the probe pin 20 in the first test step S401 and the position 23 of the probe pin 20 in the second test step S402. In FIG. 9, a vicinity of the diode element 208 is enlarged. Moreover, in the first test step S401 and the second test step S402 in this example, the same contact portion 10 is moved and used in a state where its positions with respect to the upper surface pad 210 are different from each other. That is, there is a common non-arrangement area 26 in both the first test step S401 and the second test step S402. A shift amount of the contact portion 10 in the X axis direction between the first test step S401 and the second test step S402 is defined as a first movement amount S1.

In this example, the contact portion 10 is arranged in each of the test steps such that both the non-arrangement area 26-1 in the first test step S401 and the non-arrangement area 26-2 in the second test step S402 overlap with the diode element 208. Preferably, the diode element 208 entirely overlaps with both the non-arrangement area 26-1 and the non-arrangement area 26-2. This can prevent the probe pin 20 from coming into contact with the diode element 208 even when the contact portion 10 is moved. The first width W1 of the non-arrangement area 26 in this example is larger than a sum S1+L1 of the first movement amount S1 of the contact portion 10 in the X axis direction and a first length L1 of the diode element 208 in the X axis direction.

Figure 10:
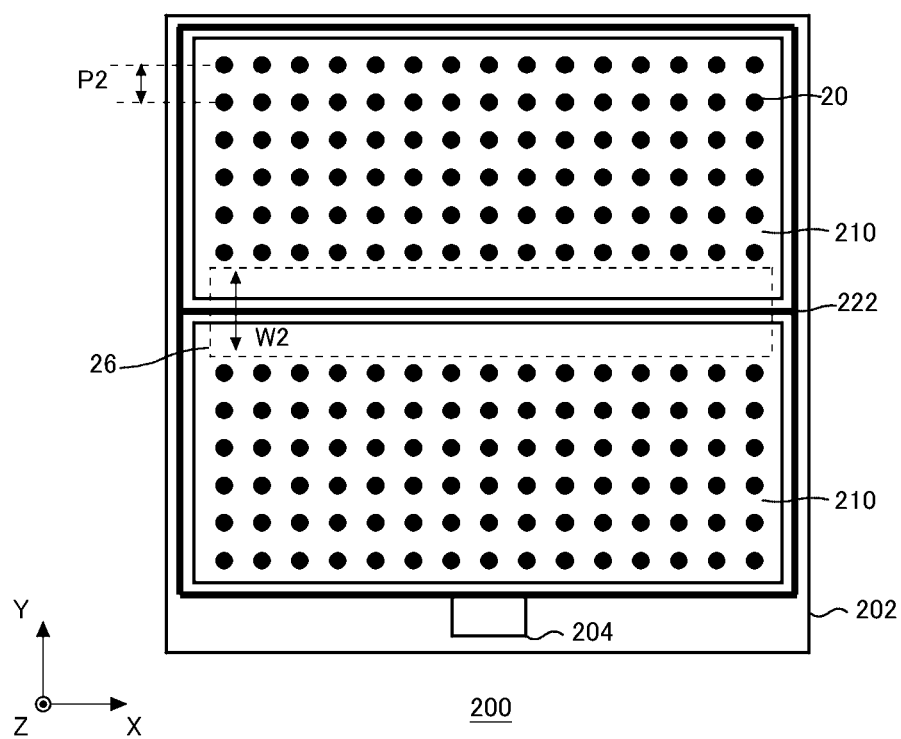
FIG. 10 shows another configuration example of the semiconductor apparatus 200.

FIG. 10 shows another configuration example of the semiconductor apparatus 200. A gate runner 222 is arranged so as not to overlap with the upper surface pad 210 on the upper surface of the semiconductor apparatus 200 in this example. The gate runner 222 is a wiring electrically connecting the control pad 204 and a gate electrode of a transistor such as an IGBT. The gate runner 222 in this example has a portion arranged so as to enclose the upper surface pad 210 and a portion arranged so as to section the upper surface pad 210. For example, the gate runner 222 has a portion extending in the X axis direction, in the vicinity of the center of the semiconductor substrate 202 in the Y axis direction.

The contact portion 10 in this example has a plurality of probe pins 20 arranged at a regular arrangement interval P2 in the Y axis direction (second direction). Moreover, the contact portion 10 has a non-arrangement area 26 where the probe pins 20 are not arranged. In the Y axis direction, the probe pins 20 are arranged on both sides of the non-arrangement area 26. The non-arrangement area 26 has a second width W2 larger than the arrangement interval P2 in the Y axis direction. For example, the second width W2 twice or more as large as the arrangement interval P2.

Figure 11:
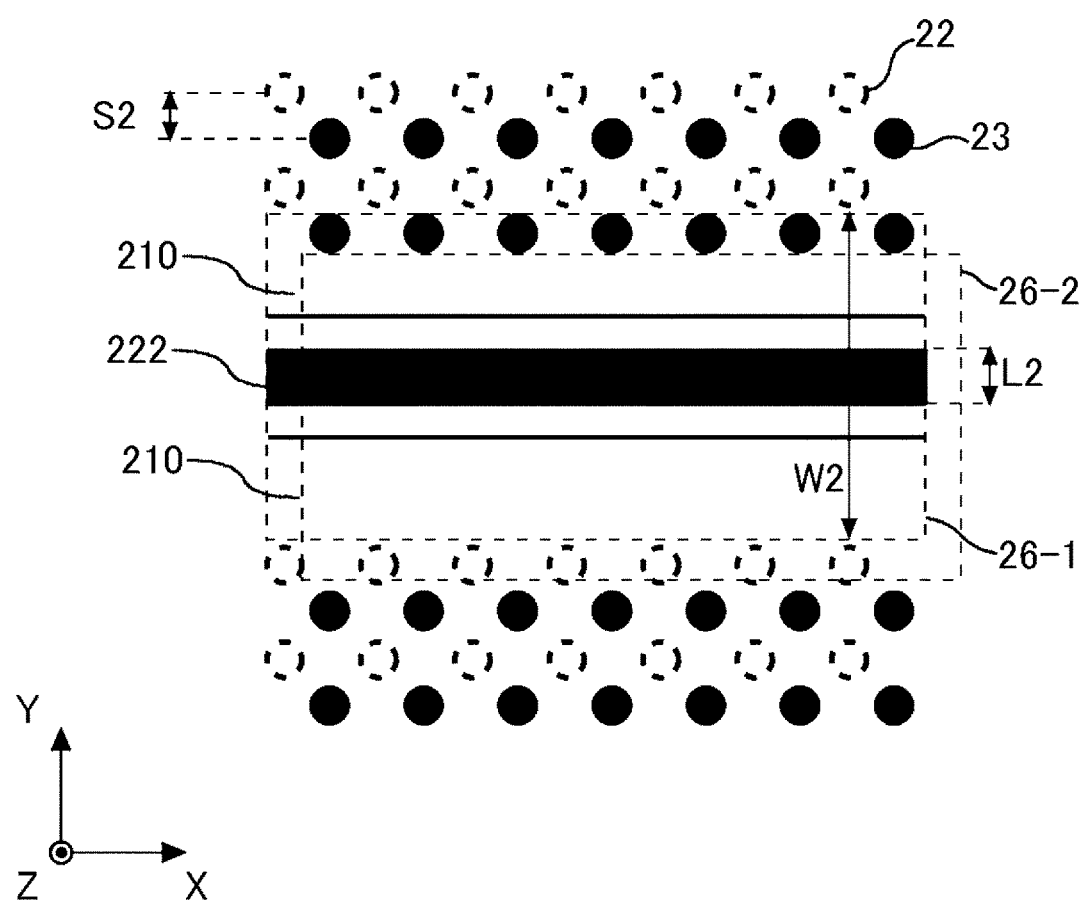
FIG. 11 shows examples of the position 22 of the probe pin 20 in the first test step S401 and the position 23 of the probe pin 20 in the second test step S402.

FIG. 11 shows examples of the position 22 of the probe pin 20 in the first test step S401 and the position 23 of the probe pin 20 in the second test step S402. In FIG. 11, a vicinity of the gate runner 222 dividing the upper surface pad 210 is enlarged. Moreover, in the first test step S401 and the second test step S402 in this example, the same contact portion 10 is moved and used in a state where its positions with respect to the upper surface pad 210 are different from each other. That is, there is a common non-arrangement area 26 in both the first test step S401 and the second test step S402. A shift amount of the contact portion 10 in the Y axis direction between the first test step S401 and the second test step S402 is defined as a second movement amount S2.

In this example, the contact portion 10 is arranged in each of the test steps such that both the non-arrangement area 26-1 in the first test step S401 and the non-arrangement area 26-2 in the second test step S402 overlap with the gate runner 222. Preferably, the entire gate runner 222 in the Y axis direction overlaps with both the non-arrangement area 26-1 and the non-arrangement area 26-2. This can prevent the probe pin 20 from coming into contact with the gate runner 222 even when the contact portion 10 is moved. The second width W2 of the non-arrangement area 26 in this example is larger than a sum S2+L2 of the second movement amount S2 of the contact portion 10 in the Y axis direction and a second length L2 of the gate runner 222 in the Y axis direction.

Figure 12:
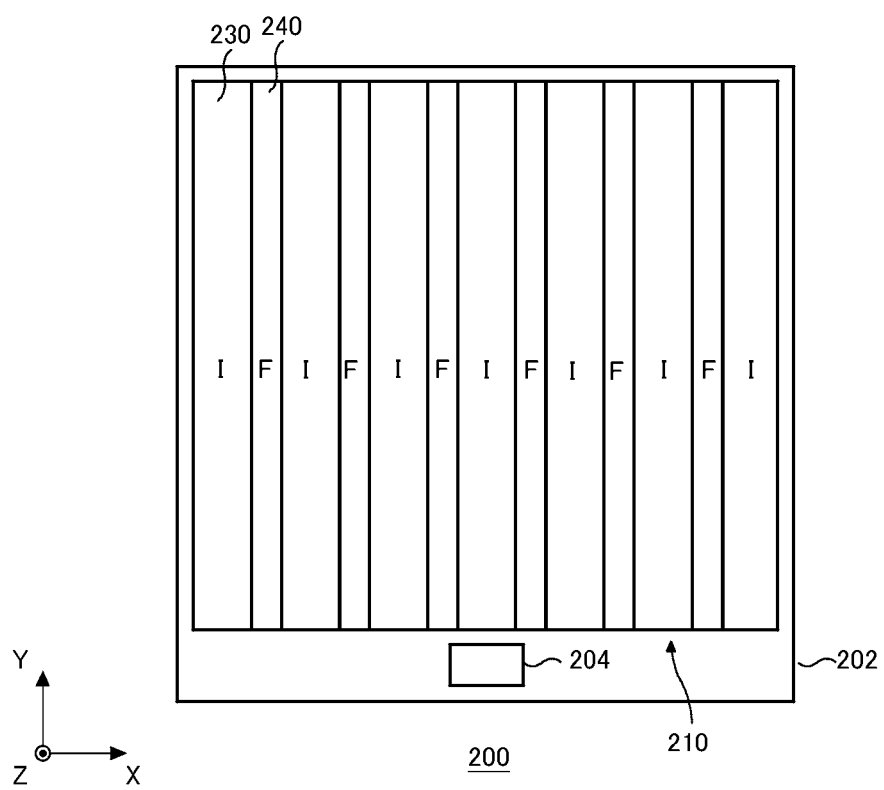
FIG. 12 shows another configuration example of the semiconductor apparatus 200.

FIG. 12 shows another configuration example of the semiconductor apparatus 200. In FIG. 12, a filled circle to indicate the position of the probe pin 20 is omitted. In the semiconductor apparatus 200 in this example, transistor portions 230 and diode portions 240 are alternately arranged in the X axis direction (first direction). Areas where the transistor portions 230 and the diode portions 240 are provided are covered with the upper surface pad 210. The transistor portions 230 include transistors such as an IGBT provided in the semiconductor substrate 202. The diode portions 240 include diodes such as a freewheeling diode (FWD) provided in the semiconductor substrate 202. The areas of the transistor portions 230 are marked with symbols "T", and the areas of the diode portions 240 are marked with symbols "F". The semiconductor apparatus 200 in this example is a so-called reverse conducting IGBT (RC-IGBT).

Figure 13:
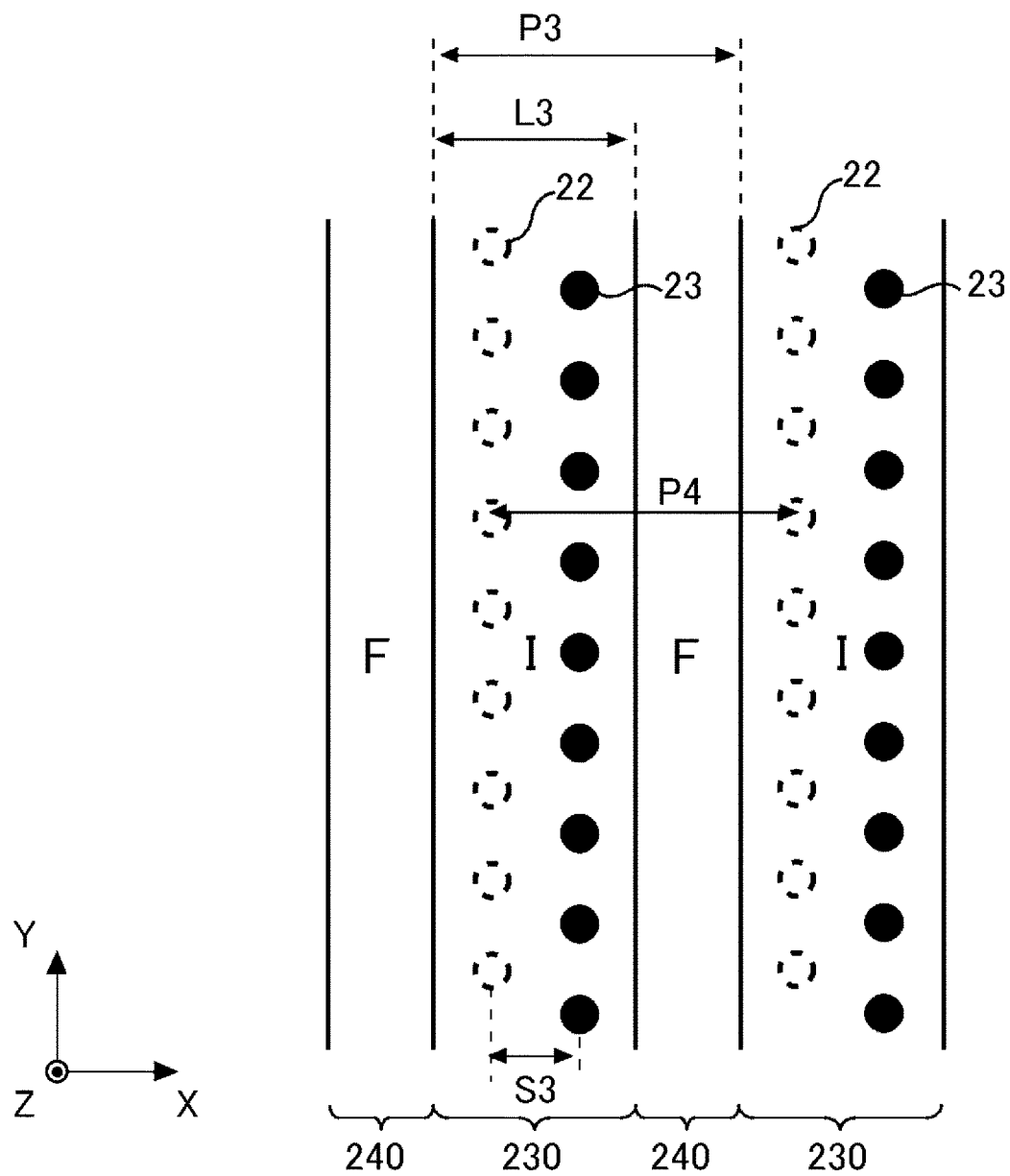
FIG. 13 shows examples of the position 22 of the probe pin 20 in the first test step S401 and the position 23 of the probe pin 20 in the second test step S402.

FIG. 13 shows examples of the position 22 of the probe pin 20 in the first test step S401 and the position 23 of the probe pin 20 in the second test step S402. In FIG. 13, vicinities of the transistor portions 230 and the diode portions 240 are enlarged. Moreover, in the first test step S401 and the second test step S402 in this example, the same contact portion 10 is moved and used in a state where its positions with respect to the upper surface pad 210 are different from each other. A shift amount of the contact portion 10 in the X axis direction between the first test step S401 and the second test step S402 is defined as a third movement amount S3.

In this example, at least one of the probe pins 20 overlaps with a same transistor portion 230 in the first test step S401 and the second test step S402. In the example of FIG. 13, for a plurality of probe pins 20 arranged along the Y axis direction, the position 22 in the first test step S401 and the position 23 in the second test step S402 overlap with the same transistor portion 230. This allows precise sorting of the semiconductor apparatus 200 having a defective point in the transistor portions 230. Since it is possible to detect a defective point of the transistor portions 230 where a so-called latch-up occurs, it is possible to precisely sort the semiconductor apparatus 200 that is easily broken. A length L3 of one transistor portion in this example in the X axis direction is larger than the third movement amount S3 of the contact portion 10 in the X axis direction.

The contact portion 10 may have the probe pins 20 overlapping with the diode portions 240 in either the first test step S401 or the second test step S402. In another example, all the probe pins 20 may be arranged on the contact portion 10 so as to overlap with the transistor portions 230 in both the first test step S401 and the second test step S402. A period P3 where the transistor portions 230 are arranged in the X axis direction and a period P4 where the probe pins 20 are arranged in the X axis direction may be same.

Figure 14:
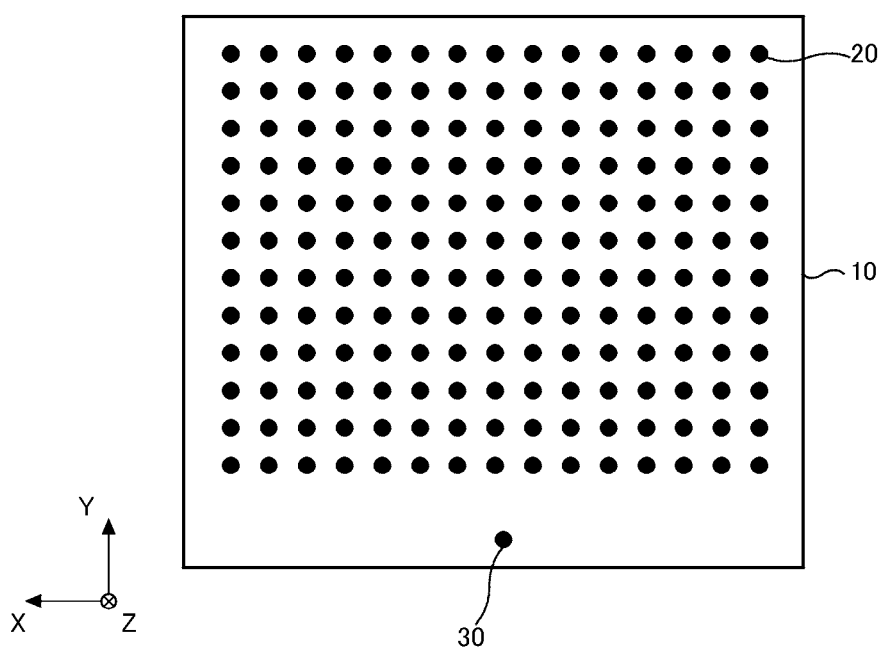
FIG. 14 shows another example of a contact portion 10.

FIG. 14 shows another example of the contact portion 10. The contact portion 10 in this example has a reference probe pin 30 and one or more probe pins 20. Arrangement of the probe pins 20 is similar to those shown in the examples of FIG. 1A to FIG. 13. In this example, the plurality of probe pins 20 are arranged two-dimensionally. A distance between the reference probe pin 30 and the nearest probe pin 20 may be larger than a distance between the probe pins 20. That is, the reference probe pin 30 may be arranged away from the plurality of probe pins 20. Moreover, the contact portion 10 may have the non-arrangement area 26 described in FIG. 8 to FIG. 11.

Figure 15:
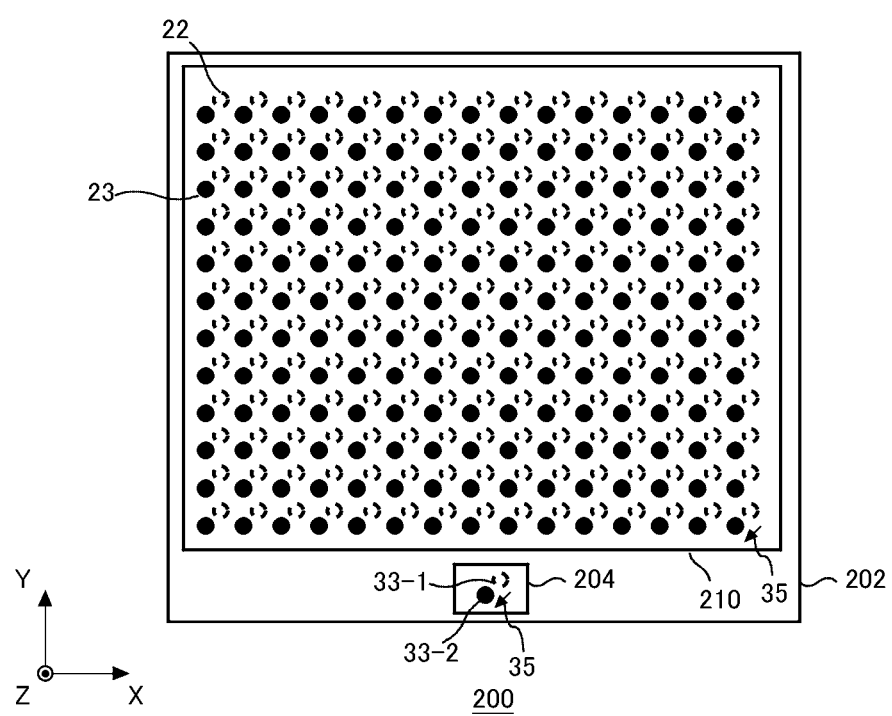
FIG. 15 shows a position of each pin on an upper surface of the semiconductor apparatus 200.

FIG. 15 shows a position of each pin on an upper surface of the semiconductor apparatus 200. In this example, the contact portion 10 shown in FIG. 14 is used with its positions shifted in the first test step S401 and the second test step S402. In the first test step S401, the reference probe pin 30 comes into contact with the semiconductor apparatus 200 at a position 33-1. Moreover, in the second test step S402, the reference probe pin 30 comes into contact with the semiconductor apparatus 200 at a position 33-2.

In the first test step S401 and the second test step S402, the reference probe pin 30 may be brought into contact with a pad smaller than the upper surface pad 210. For example, the reference probe pin 30 may be brought into contact with the control pad 204, the measuring pad 206, or another pad. The reference probe pin 30 in this example is in contact with the control pad 204. The test control unit 110 controls the position of the probe pin 20 by positioning the reference probe pin 30 with respect to the control pad 204.

In this example, the position 33-1 and the position 33-2 of the reference probe pin 30 are arranged on the control pad 204. In FIG. 15, a shift amount between the position 33-1 and the position 33-2 is indicated by a vector 35. Between the first test step S401 and the second test step S402, a position of the contact portion 10 is changed in a direction and by a movement amount that are indicated by the vector 35. As such, on the upper surface pad 210, the shift amount of the position 23 with respect to the position 22 is represented by the vector 35.

Each pad of the semiconductor apparatus 200 at the time of shipment has a contact trace at a position with which the probe pin came into contact. In this example, there are two contact traces on the control pad 204 and more contact traces on the upper surface pad 210. Positions of the contact traces are similar to the positions 22, 23, and 33 of the probe pin.

In this specification, the two contact traces on the control pad 204 are referred to as reference contact traces. Moreover, many contact traces on the upper surface pad 210 are referred to as measurement contact traces. A shift amount between the two reference contact traces is represented by the vector 35. Moreover, each of the measurement contact traces on the upper surface pad 210 is arranged with a shift amount corresponding to the vector 35 with respect to the other measurement contact traces. That is, a direction and a distance of position shift between the two reference contact traces are equal to a direction and a distance of a position shift between two paired measurement contact traces. As described in FIG. 1A to FIG. 13, the semiconductor apparatus 200 having such a structure is being inspected for presence or absence of a defective point in a wide test area, so that it can be less likely to be broken after shipment.

Figure 16:
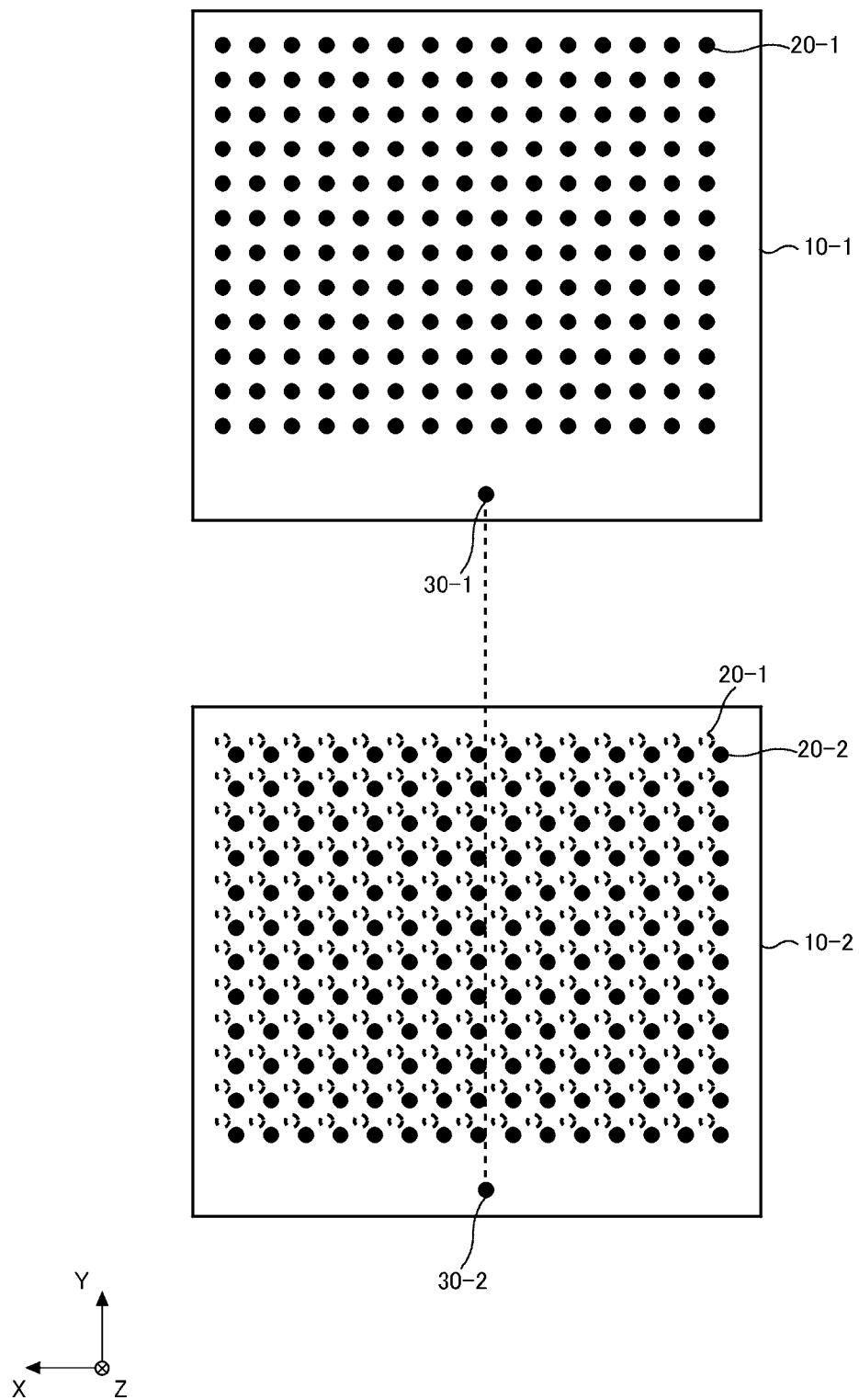
FIG. 16 shows another example of the contact portion 10.

FIG. 16 shows another example of the contact portion 10. The test apparatus 100 in this example uses a first contact portion 10-1 having a plurality of probe pins 20-1 in the first test step S401, and uses a second contact portion 10-2 having a plurality of probe pins 20-2 in the second test step S402. The first contact portion 10-1 and the second contact portion 10-2 are different components.

The first contact portion 10-1 has a first reference probe pin 30-1 and one or more first probe pins 20-1. In this example, a plurality of first probe pins 20-1 are arranged two-dimensionally.

The second contact portion 10-2 has a second reference probe pin 30-2 and one or more second probe pins 20-2. In this example, a plurality of second probe pins 20-2 are arranged two-dimensionally.

Relative positions of the one or more second probe pins 20-2 with respect to the second reference probe pin 30-2 are different from relative positions of the one or more first probe pins 20-1 with respect to the first reference probe pin 30-1. In the second contact portion 10-2, the first probe pins 20-1 are indicated by dashed lines and the second probe pins 20-2 are indicated by filled circles, for when the first reference probe pin 30-1 and the second reference probe pin 30-2 are at a same position.

As shown in FIG. 16, when the positions of the reference probe pins 30 are common, the plurality of second probe pins 20-2 are shifted by a predetermined movement amount with respect to the plurality of first probe pins 20-1. A shift amount between the first probe pin 20-1 and the second probe pin 20-2 may be similar to the shift amount between the position 22 and the position 23 described in FIG. 1A to FIG. 15. Moreover, each of the contact portions 10 may have the non-arrangement area 26 described in FIG. 8 to FIG. 11.

Figure 17:
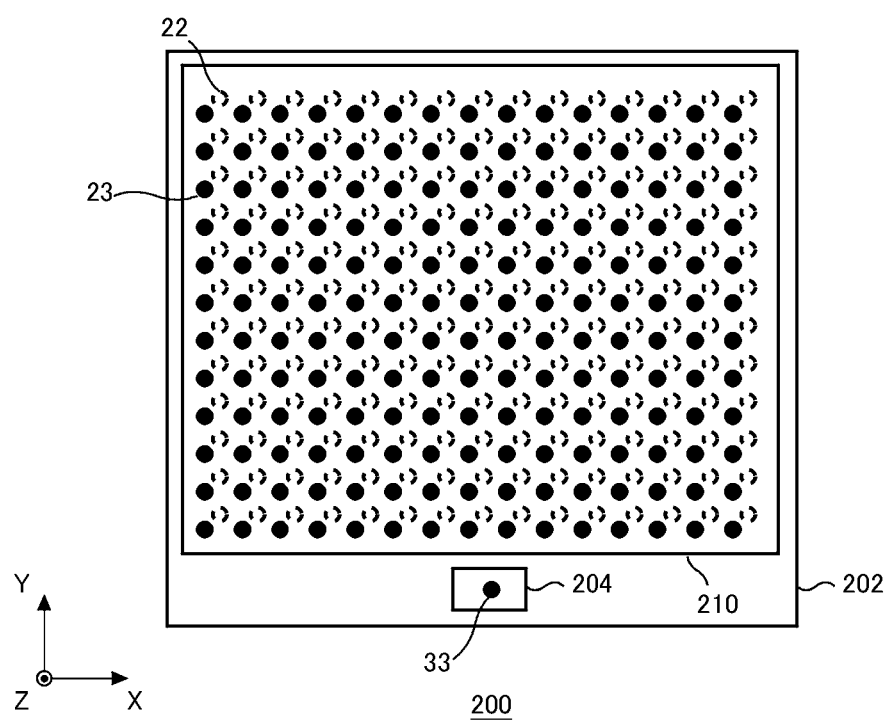
FIG. 17 shows examples of the position 22 of a first probe pin 20-1 and the position 23 of a second probe pin 20-2.

FIG. 17 shows examples of the position 22 of the first probe pin 20-1 and the position 23 of the second probe pin 20-2. In this example, the first contact portion 10-1 and the second contact portion 10-2 are arranged such that a position 33 of the first reference probe pin 30-1 in the first test step S401 and a position 33 of the second reference probe pin 30-2 in the second test step S402 are same. In this example, the first reference probe pin 30-1 and the second reference probe pin 30-2 come into contact with a pad other than the upper surface pad 210. The first reference probe pin 30-1 and the second reference probe pin 30-2 may both come into contact with the control pad 204. In another example, the first reference probe pin 30-1 and the second reference probe pin 30-2 may both come into contact with the measuring pad 206.

As shown in FIG. 16, bringing the first reference probe pin 30-1 and the second reference probe pin 30-2 into contact with the control pad 204 at a same position 33 allows the position 22 and the position 23 on the upper surface pad 210 to be arranged so as to be shifted from each other. Such a method can also detect a defective point in a wide test area and precisely screen the semiconductor apparatus 200.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test method of a semiconductor apparatus, the semiconductor apparatus comprising a pad, the test method comprising:
    bringing one or more probe pins into contact with the pad;
    testing the semiconductor apparatus in a first test step with the one or more probe pins in contact with the pad with each of the one or more probe pins contacting the pad at a corresponding first contact position;
    bringing the one or more probe pins into contact with the pad of the semiconductor apparatus in a shifted state where each of the one or more probe pins are in contact with the pad at a corresponding second contact position that is displaced by a distance from the corresponding first contact position; and
    testing the semiconductor apparatus in a second test step with the one or more probe pins in the shifted state,
    wherein in the first test step, a corresponding first test area having a center and a predefined size is set for each of the one or more probe pins, with the center of the corresponding first test area being located at the corresponding first contact position for each of the one or more probe pins, so as to allow the semiconductor apparatus can be screened for the presence of a defective point beneath the pad and covered by the corresponding first test area with each of the one or more probe pins located at the corresponding first contact position thereof, and
    wherein in the second test step, a corresponding second test area having a center and a predefined size is set for each of the one or more probe pins, with the center of the corresponding second test area being located at the corresponding second contact position for each of the one or more probe pins, so as to allow the semiconductor apparatus can be screened for the presence of a defective point beneath the pad and covered by the corresponding second test area, and not covered by the corresponding first test area, with each of the one or more probe pins located at the corresponding second contact position thereof.

2. The test method according to claim 1, wherein the first test step and the second test step are for testing the semiconductor apparatus under different conditions.

3. The test method according to claim 2, wherein the one or more probe pins comprise a plurality of probe pins, each of the plurality of probe pins being in contact with the pad at the corresponding first contact position on the pad during the first test step and each of the plurality of probe pins being in contact with the pad at the corresponding second contact position on the pad during the second test step, and wherein
    in the second test step, the corresponding second contact position on the pad for at least one of the plurality of probe pins is located between the corresponding first contact position on the pad for the at least one of the plurality of probe pins and the corresponding first contact position on the pad for at least another one of the plurality of probe pins.

4. The test method according to claim 2, wherein
    the corresponding first contact position for each of the one or more probe pins in the first test step and the corresponding second contact position for each of the one or more probe pins in the second test step are set such that a portion where the corresponding first test area and the corresponding second test area overlap with each other is minimized.

5. The test method according to claim 2, wherein
    the one or more probe pins comprise a plurality of probe pins,
    a contact portion provided with the plurality of probe pins is used in a second contact portion position with respect to the pad, corresponding to the plurality of probe pins being in the shifted state, in the second test step,
    the contact portion is used in a first contact portion position with respect to the pad in the first test step, the second contact portion position being different from the first contact portion position,
    the pad and a diode element are arranged on an upper surface of the semiconductor apparatus so as not to overlap with each other,
    in the contact portion, the one or more probe pins are arranged at a regular arrangement interval in a first direction,
    the contact portion has a first width larger than the arrangement interval in the first direction and has a non-arrangement area where the one or more probe pins are not arranged, and
    in both the first test step and the second test step, the contact portion is arranged such that the diode element overlaps with the non-arrangement area.

6. The test method according to claim 1, wherein the first test step and the second test step are for testing the semiconductor apparatus under identical conditions except for each of the one or more probe pins being in the corresponding first contact position during the first test step and for each of the one or more probe pins being in the corresponding second contact position during the second test step.

7. The test method according to claim 6, wherein the one or more probe pins comprise a plurality of probe pins, each of the plurality of probe pins being in contact with the pad at the corresponding first contact position on the pad during the first test step and each of the plurality of probe pins being in contact with the pad at the corresponding second contact position on the pad during the second test step, and wherein
    in the second test step, the corresponding second contact position on the pad for at least one of the plurality of probe pins is located between the corresponding first contact position on the pad for the at least one of the plurality of probe pins and the corresponding first contact position on the pad for at least another one of the plurality of probe pins.

8. The test method according to claim 6, wherein
    the corresponding first contact position for each of the one or more probe pins in the first test step and the corresponding second contact position for each of the one or more probe pins in the second test step are set such that a portion where the corresponding first test area and the corresponding second test area overlap with each other is minimized.

9. The test method according to claim 6, wherein
    the one or more probe pins comprise a plurality of probe pins, a contact portion provided with the plurality of probe pins is used in a second contact portion position with respect to the pad, corresponding to the plurality of probe pins being in the shifted state, in the second test step, the contact portion is used in a first contact portion position with respect to the pad in the first test step, the second contact portion position being different from the first contact portion position, the pad and a diode element are arranged on an upper surface of the semiconductor apparatus so as not to overlap with each other, in the contact portion, the one or more probe pins are arranged at a regular arrangement interval in a first direction, the contact portion has a first width larger than the arrangement interval in the first direction and has a non-arrangement area where the one or more probe pins are not arranged, and in both the first test step and the second test step, the contact portion is arranged such that the diode element overlaps with the non-arrangement area.

10. The test method according to claim 1, wherein the one or more probe pins comprise a plurality of probe pins, each of the plurality of probe pins being in contact with the pad at a corresponding one of a plurality of first contact positions on the pad during the first test step and each of the plurality of probe pins being in contact with the pad at a corresponding one of a plurality of second contact positions on the pad during the second test step, and wherein in the second test step, the corresponding one of the plurality of second contact positions on the pad for at least one of the plurality of probe pins is located between the corresponding one of the plurality of first contact positions on the pad for the at least one of the plurality of probe pins and the corresponding one of the plurality of first contact positions on the pad for at least another one of the plurality of probe pins.

11. The test method according to claim 10, wherein the corresponding one of the plurality of first contact positions for each of the plurality of probe pins in the first test step and the corresponding one of the plurality of second contact positions for each of the plurality of probe pins in the second test step are set such that a portion where the corresponding first test area and the corresponding second test area overlap with each other is minimized.

12. The test method according to claim 10, wherein in the second test step, the corresponding one of the plurality of second contact positions on the pad for the at least one of the plurality of probe pins is located at the midpoint between the corresponding one of the plurality of first contact positions on the pad for the at least one of the plurality of probe pins and the corresponding one of the plurality of first contact positions on the pad for the at least another one of the plurality of probe pins.

13. The test method according to claim 12, wherein the corresponding one of the plurality of first contact positions for each of the plurality of probe pins in the first test step and the corresponding one of the plurality of second contact positions for each of the plurality of probe pins in the second test step are set such that a portion where the corresponding first test area and the corresponding second test area overlap with each other is minimized.

14. The test method according to claim 1, wherein the corresponding first contact position for each of the one or more probe pins in the first test step and the corresponding second contact position for each of the one or more probe pins in the second test step are set such that a portion where the corresponding first test area and the corresponding second test area overlap with each other is minimized.

15. The test method according to claim 14, wherein a size of at least one of the first test area or the second test area is changed according to a test condition.

16. The test method according to claim 1, wherein the one or more probe pins comprise a plurality of probe pins, a contact portion provided with the plurality of probe pins is used in a second contact portion position with respect to the pad, corresponding to the plurality of probe pins being in the shifted state, in the second test step, the contact portion is used in a first contact portion position with respect to the pad in the first test step, the second contact portion position being different from the first contact portion position, the pad and a diode element are arranged on an upper surface of the semiconductor apparatus so as not to overlap with each other, in the contact portion, the one or more probe pins are arranged at a regular arrangement interval in a first direction, the contact portion has a first width larger than the arrangement interval in the first direction and has a non-arrangement area where the one or more probe pins are not arranged, and in both the first test step and the second test step, the contact portion is arranged such that the diode element overlaps with the non-arrangement area.

17. The test method according to claim 16, wherein in the second test step, the contact portion is used being shifted, by a first movement amount in the first direction, relative to the first contact portion position, the diode element has a first length in the first direction, and a first width of the non-arrangement area in the first direction is larger than a sum of the first movement amount and the first length.

18. The test method according to claim 1, wherein the one or more probe pins comprise a plurality of probe pins, a contact portion provided with the plurality of probe pins is used in a second contact portion position with respect to the pad, corresponding to the plurality of probe pins being in the shifted state, in the second test step, the contact portion is used in a first contact portion position with respect to the pad in the first test step, the second contact portion position being different from the first contact portion position, transistor portions and diode portions are alternately arranged in a first direction in the semiconductor apparatus, at least one of the plurality of probe pins overlaps one of the transistor portions in the first test step and the at least one of the plurality of probe pins overlaps the same one of the transistor portions in the second test step.

19. A test method of a semiconductor apparatus, the semiconductor apparatus comprising a pad, the test method comprising:

bringing a first plurality of probe pins into contact with the pad;

testing the semiconductor apparatus in a first test step with the first plurality of probe pins in contact with the pad with each of the first plurality of probe pins contacting the pad at a corresponding first contact position;

bringing a second plurality of probe pins into contact with the pad of the semiconductor apparatus in a shifted state where each of the second plurality of probe pins are in contact with the pad at a corresponding second contact position that is displaced by a distance from the corresponding first contact position of a corresponding one of the first plurality of probe pins; and testing the semiconductor apparatus in a second test step with the second plurality of probe pins in the shifted state, wherein in the first test step, a first contact portion having the first plurality of probe pins is used, and in the second test step, a second contact portion having the second plurality of probe pins, and which is different from the first contact portion, is used.

20. The test method according to claim 19, wherein the first contact portion has a first reference probe pin and one or more first probe pins, the second contact portion has a second reference probe pin and one or more second probe pins, relative positions of the one or more second probe pins with respect to the second reference probe pin are different from relative positions of the one or more first probe pins with respect to the first reference probe pin, the first contact portion and the second contact portion are configured such that when the first reference probe pin and the second reference probe pin are at the same position on the semiconductor apparatus, during the first test step and during the second test step, respectively, then the one or more second probe pins are in the shifted state on the pad relative to the one or more first probe pins.

* * * * *